United States Patent [19]

Marcus et al.

[11] Patent Number: 4,786,890
[45] Date of Patent: Nov. 22, 1988

[54] METHOD AND APPARATUS FOR IMPLEMENTING A PRML CODE

[75] Inventors: Brian H. Marcus, Sunnyvale; Arvind M. Patel; Paul H. Siegel, both of San Jose, all of Calif.

[73] Assignee: International Business Machines Corporation, Armonk, N.Y.

[21] Appl. No.: 78,731

[22] Filed: Jul. 28, 1987

[51] Int. Cl.[4] .............................................. H03M 7/00
[52] U.S. Cl. ..................................... 341/81; 360/40; 341/95
[58] Field of Search ................... 340/347 DD; 360/40

[56] References Cited

U.S. PATENT DOCUMENTS 4,567,464 1/1986 Seigel et al. ................. 340/347 DD

OTHER PUBLICATIONS

Y. Kabal and S. Pasupathy, "Partial-Response Signaling", IEEE Trans. Commun. Technol., vol. COM-23, pp. 921-934, 9/75.
G. D. Forney, Jr., "The Viterbi Algorithm", Proc. IEEE, vol. 61, pp. 268-278, 3/73.
R. W. Lucky, J. Salz and E. J. Weldon, Jr., Principles of Data Communications, New York: McGraw-Hill, 1968.
J. M. Wozencraft and I. M. Jacobs, Principles of Communications Engineering, New York: Wiley, 1965.
G. D. Forney, "Maximum Likelihood Sequence Estimation of Digital Sequences in the Presence of Intersymbol Interference", IEEE Trans. Inform. Theory, vol. IT-18, pp. 363-378, May 1972.
H. Kobayashi, "Application of Probabilistic Decoding to Digital Magnetic Recording", IBM J. Res. Develop., vol. 15, pp. 64-75, Jan. 1971.
K. Nishimura and K. Ishii, "A Design Method for Optimal Equalization in Magnetic recording Channels with Partial Response Channel Coding", IEEE Trans. Magn., vol. MAG-19, pp. 1719-1721, 9/83.

Primary Examiner—William M. Shoop, Jr.
Assistant Examiner—Richard K. Blum
Attorney, Agent, or Firm—Maurice H. Klitzman; H. E. Otto, Jr.

[57] ABSTRACT

A rate 8/9, constrained partial response class IV code having run length limitation parameters (0,3/5) is provided for any partial response (PR) signaling system employing maximum likelihood (ML) detection.

7 Claims, 4 Drawing Sheets

METHOD AND APPARATUS FOR IMPLEMENTING A PRML CODE

CROSS REFERENCE TO RELATED APPLICATION

The present invention is related to application Ser. No. 855,641 entitled "Method and Apparatus for Implementing Optimum PRML Codes" filed Apr. 24, 1986 by J. S. Eggengerger et al, and assigned to the assignee of the present invention.

BACKGROUND OF THE INVENTION

Field of the Invention

This invention relates to techniques for encoding data. More particularly, it relates to a Partial Response Maximum Likelihood technique for encoding a preselectable number of bits of binary data into codewords having a preselectable number of bits on a class-IV channel using a run length limited (RLL) code.

DESCRIPTION OF THE RELATED ART

Partial Response Maximum Likelihood techniques have long been associated with digital communication channels. ML detection is typically used in PR class-IV channels (hereinafter, the acronym PRML is used to denote the combination of PR class-IV channels with ML detection).

Further, encoding data for use with recording channels is also known. The (d,k) constraints, which specify the minimum and maximum run lengths of zeroes, respectively, in RLL codes used in peak-detection systems, reduce intersymbol interferences (hereinafter, ISI) while maintaining self-clocking characteristics of the data signal. See, for example, IBM TECHNICAL DISCLOSURE BULLETIN, Vol. 28, No. 5, October 1985, pp. 1938-1940, entitled "Improved Encoder and Decoder for a Byte-Oriented (0,3) 8/9 Code", IBM TECHNICAL DISCLOSURE BULLETIN, Vol. 18, No. 1, June 1975, pp. 248-251, entitled "Encoder and Decoder for a Byte-Oriented (0,3) 8/9 Code", and the above-identified related application Ser. No. 855,641 which discloses both a (0,3/6) and a (0,4/4) PRML method and apparatus.

In a PRML channel, a channel code can also be used to provide clocking and automatic gain control (AGC) information. Since the maximum run length of nominally zero samples must be limited, the k constraint is still appropriate when specifying the channel code requirements for PRML channels. However, RLL codes with d greater than zero are not necessary in PRML channels because compensation for ISI is inherent in the ML detector. Thus, there is no need to reduce interference by coding with a d constraint.

On the other hand, the k constraint is not the only constraint required for the PRML channel. The $k_1$ constraint is an additional constraint that is used to limit both detector delay and hardware complexity. If a data sequence of the input signal is demultiplexed into an even indexed sample subsequence and an odd indexed sample subsequence, and ML detection is applied to each subsequence independently, a constraint on the number of successive nominally zero samples in each subsequence adequately limits the detector delay and hardware. Thus, in terms of NRZI data representation, the required limitation is on the maximum number of sequential zeroes in both the even-indexed and the odd-indexed subsequences. The maximum number of sequential NRZI zeros in either subsequence is referred to as the $k_1$ constraint, and is analogous to the k constraint for the interleaved sequence of data.

Codes having run length constraints restrict the allowed code sequences to less than 2 to the power of n sequences possible, where n specifies the number of data symbols in a sequence. The rate of such a code is less than 1 data bit to 1 code bit, which can be expressed as a ratio of small integers. Thus, if an 8-bit data byte is mapped into a 9-bit codeword, the code rate is 8/9.

The (0,3/6) and (0,4/4) codes disclosed by Eggenberger differ in the following manner. The k parameter is desirable for accurate timing and gain control. Therefore, the (0,3/6) code disclosed by Eggenberger, which uses a smaller value of k (3) will provide more accurate timing and gain control than the (0,4/4) code. However, it has a disadvantage relative to the (0,4/4) code in that it requires more hardware in the Viterbi detector path memory. Alternatively, a small $k_1$ parameter will reduce the size of the path memory required in the ML detector. Therefore, the (0,4/4) code will require a smaller path memory than the (0,3/6) code. Likewise, the (0,4/4) code has a disadvantage relative to the (0,3/6) code in that it does not have timing and gain control equal to the (0,3/6) code. Since these codes cannot be simultaneously used, a design choice must be made depending on the relative importance of the advantages inherent in each code.

SUMMARY OF THE INVENTION

It is an object of this invention to implement a single class-IV PRML modulation code which has the timing and gain control advantages of the (0,3/6) PRML code, and the reduced Viterbi detector path memory hardware requirement advantages of the (0,4/4) PRML code.

This and other objects will become apparent when read in light of the accompanying specification and drawings. The above object is carried out by a (0,3/5) modulation code suitable for class-IV PR channels employing ML detection. The (0,3/5) code receives input data comprised of a preselectable number of bits of binary data which are encoded into sequences of codewords having a preselectable number of bits. The sequences of codewords are arranged into odd and even interleaved subsequences, each sequence having no more than three consecutive zero bits of binary data and each odd and even subsequence having no more than five consecutive zero bits of binary data. In like fashion, the codewords produced by the encoder can be used as input to a decoder. The decoder receives the codewords and produces sequences of binary data in response to the codewords.

DESCRIPTION OF THE PREFERRED EMBODIMENT

Figure 1:
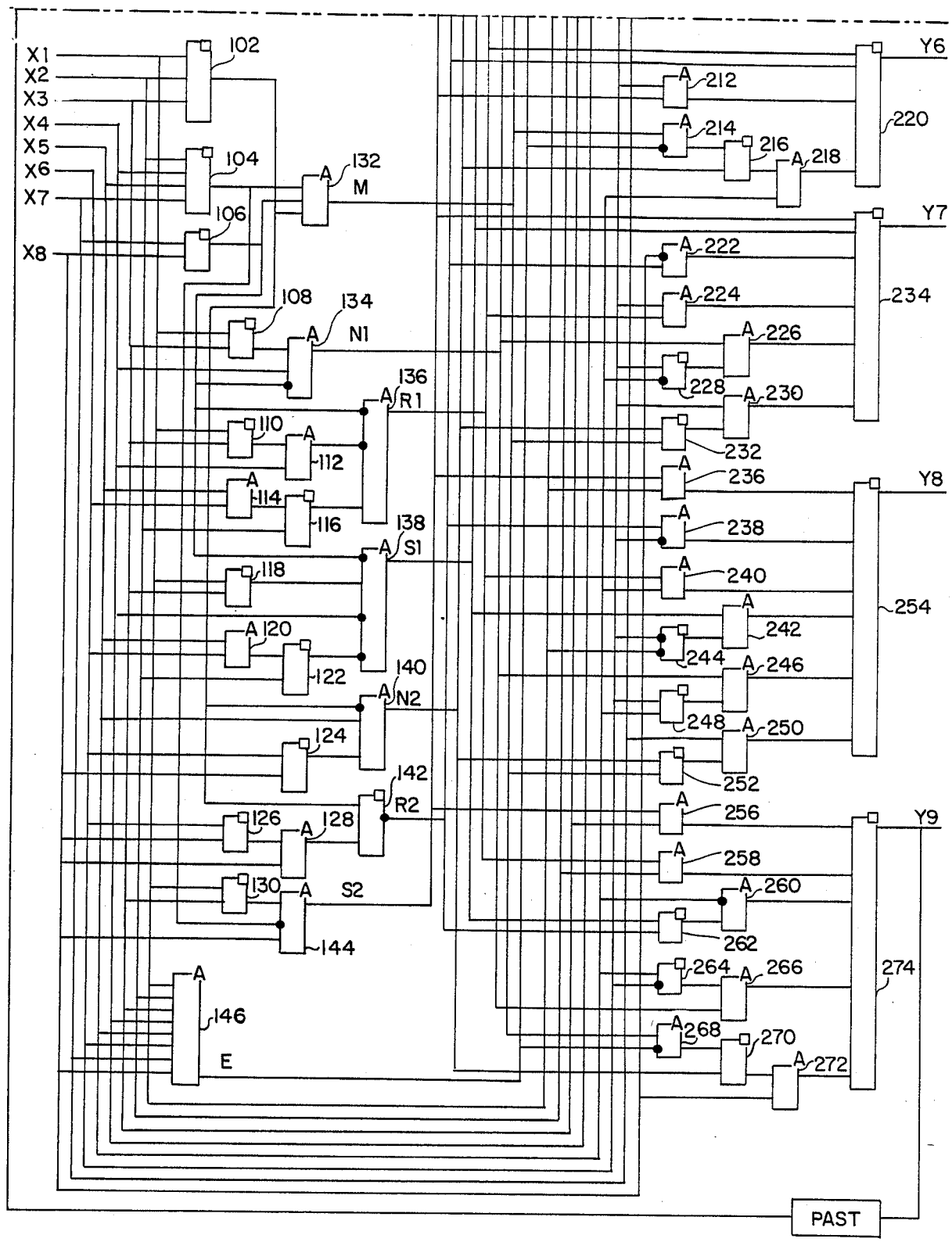
FIGS. 1 and 1A are a schematic diagram of a PRML system modulation code encoder for a code having rate 8/9 and run length constraints (0,3/5), constructed according to the principles of the present invention.

In accordance with the present invention, a method and apparatus is disclosed for encoding and decoding a preselectable number of binary bits into codewords having a preselectable number of bits. The method and apparatus utilize a (0,3/5) PRML modulation code to encode 8 bit binary data into codewords comprised of 9 bit code sequences. The maximum number of consecutive zeroes allowed within a code sequence is 3, and the maximum number of consecutive zeroes in the all-even or all-odd subsequences is 5.

The (0,3/5) code is designed for a specific partial response (PR) channel, namely the so-called "class-IV" PR. Class-IV partial response refers to a channel response whose output waveform is described by taking the input waveform, and subtracting from it the same waveform delayed by 2 bit intervals. This is described digitally in terms of a channel polynomial, P(D). For class-IV partial response:

$$P(D) = (1 - D^2) \quad (1)$$

The polynomial describes the effect of the channel on digital inputs. The D operator means "delay one bit time", and $D^2$ means "delay 2 bit times." Therefore, the class-IV channel produces output sampel U at time t which is equal to the input W at time t, minus the input W at time t−2. In other words:

$$U_t = W_t - W_{t-2} \quad (2)$$

The moduolation code is characterized by three parameters d, k, and $k_1$ written (d,k/$k_1$). The parameters d and k represent the minimum and maximum run lengths of zeros in the channel output code bit sequence, where a run length of zeroes may be regarded as a period of silence in the detection process. The parameter $k_1$ represents the maximum run length of zeros in the particular all-even or all-odd subsequences. In the present invention, d equals 0 since a minimum run length of zeroes is inapposite in the context of PRML channel. The value of k is set to three and the value of $k_1$ is set to 5. A small value of k is desirable for accurate timing and gain control, and a small value of $k_1$ reduces the size of the path memory required in the ML detector.

A rate 8/9 RLL block code having (0,3/5) constraints provides at most 251 9-bit codewords from 8-bit data bytes. Two hundred fifty six codewords can be derived by excluding the all-ones codeword and adding 6 state dependent codeword pairs for two states encoding. The states 1 and 2 are identified by the value of the last bit of the previous codeword concatenation. Thus, 256 codewords of 9 bits each can be defined where all catenations of such codewords comply with the d,k/$k_1$ constraint and two state encoding is used. The code provides for specific assignment of 8-bit data bytes to 9-bit codewords which creates partitions of bytes and codewords with similar structure. The partitions of bytes are uniquely identifiable and overall mapping of the codewords is produced by gating partition bits according to simple boolean functions.

If Y denotes a 9-bit codeword in the (0,3/5) code, then $$Y = [Y_1, Y_2, Y_3, Y_4, Y_5, Y_6, Y_7, Y_8, Y_9] \quad (3)$$

The constraint k=3 in the overall coded sequence can be produced by eliminating 9-bit sequences with run lengths of 3 zeroes at the left end thereof, run lengths of 2 zeroes at the right end thereof, or run lengths of 4 zeroes within each 9-bit sequence. Such a constraint is given by the following boolean relation:

$$(Y_1+Y_2+Y_3)(Y_2+Y_3+Y_4+Y_5)(Y_3+Y_4+Y_5+Y_6)$$
$$(Y_4+Y_5+Y_6+Y_7)(Y_5+Y_6+Y_7+Y_8)(Y_8+Y_9) = 1 \quad (4)$$

Similarly, the constraint $k_1 = 5$ is described by the following two equations for the sequence of all odd-bit positions and the sequence of all even-bit positions, respectively, in Equations (5) and (6) given below.

$$(Y_1+Y_3+Y_5)(Y_5+Y_7+Y_9) = 1 \quad (5)$$

$$(Y_2+Y_4+Y_6+Y_8) = 1 \quad (6)$$

Two hundred fifty one valid 9-bit binary sequences satisfy Equations (4), (5), and (6), the decimal equivalents for which are given in Table III.

Figure 1A:
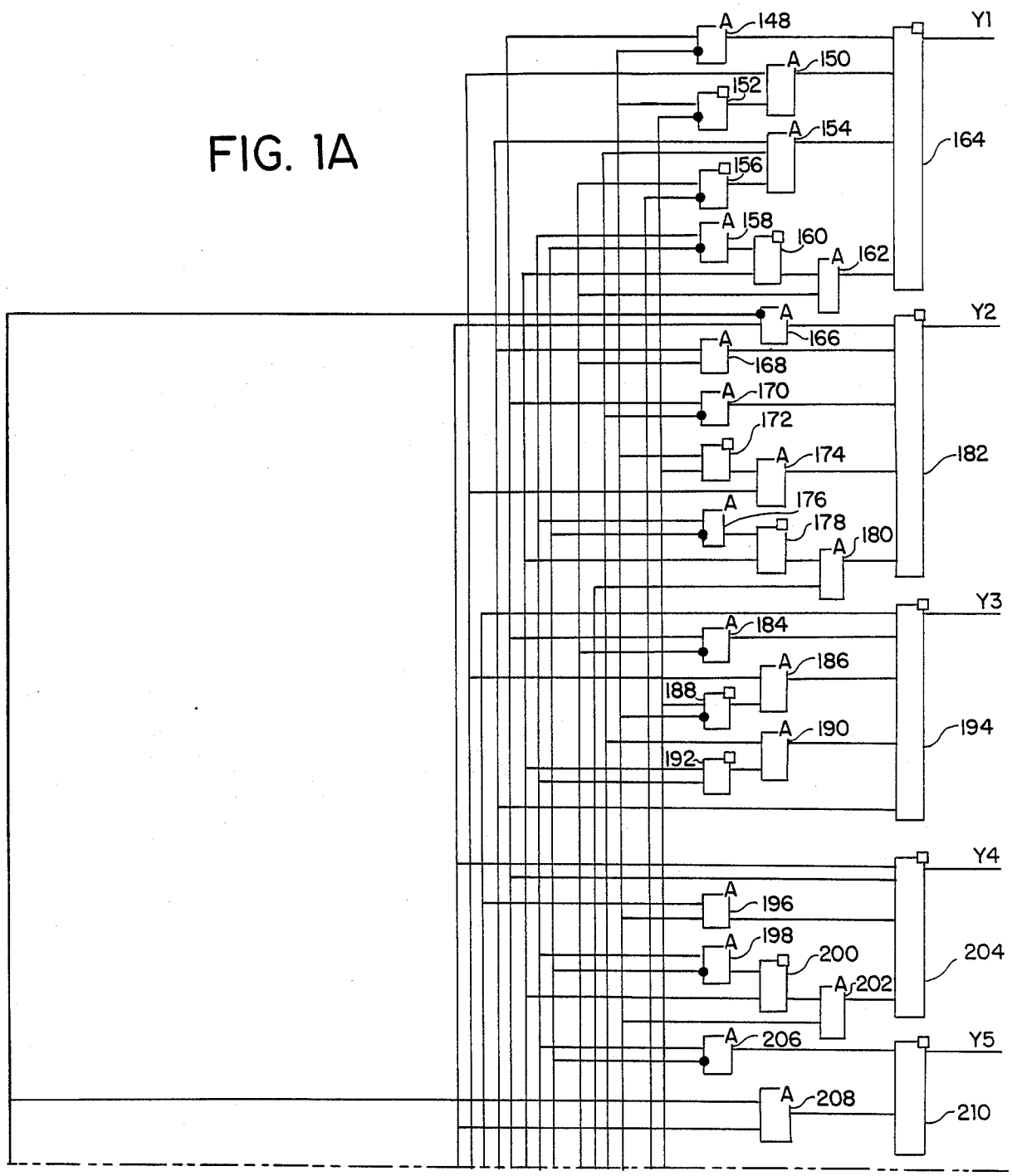

Referring now to FIGS. 1 and 1A, an 8-bit binary data byte, denoted X, and its assigned 9-bit codeword, Y, are given by:

$$X = [X_1, X_2, X_3, X_4, X_5, X_6, X_7, X_8] \quad (7)$$

$$Y = [Y_1, Y_2, Y_3, Y_4, Y_5, Y_6, Y_7, Y_8, Y_9] \quad (8)$$

The first partition of codeword assignments, denoted M, comprises the set of data bytes in which the first and last four bits of the 8-bit binary data bytes can be mapperd without change into the first and last four bits, respectively, of the 9-bit codeword, Y. The middle bit, i.e. the fifth bit position, of the 9-bit codeword in this partition is always 1. Thus, partition M comprises 162 codewords which can be identified by the relation:

$$M_1 = (X_1 + X_2 + X_3) \quad (9)$$

$$M_2 = (X_7 + X_8) \quad (10)$$

$$M_3 = (X_2 + X_4 + X_5 + X_7) \quad (11)$$

$$M = M_1 M_2 M_3 \quad (12)$$

The remaining codeword assignments are divided into partitions $N_1$, $R_1$, $S_1$, $N_2$, $R_2$ and $S_2$, which identify 24, 25, 9, 10, 20 and 6 codeword assignments, respectively. These assignments are given by the following structures of the bits in X:

$$N_1 = \overline{M_2}(X_1+X_3)X_4 \quad (13)$$

$$R_1 = \overline{M_2}(X_2+X_5X_6)(\overline{X_1+X_3})\overline{X_4} \quad (14)$$

$$S_1 = \overline{M_2}(\overline{X_2+X_5X_6})(X_1+X_3)\overline{X_4} \quad (15)$$

$$N_2 = \overline{M_1}(X_8+X_6)X_5 \quad (16)$$

$$R_2 = \overline{M_1}(\overline{X_8+X_6})X_5 \quad (17)$$

$$S_2 = \overline{M_3}(X_1+X_3)X_8 \quad (18)$$

The six state-dependent codewords, together with decimal equivalents of the possible values, are given in Table IV.

To avoid an all ones coded sequence, the middle bit, $Y_5$, is changed to zero which, in turn, creates another valid codeword. The partition E defines the all-ones codeword as follows:

$$E = X_1X_2X_3X_4X_5X_6X_7X_8 \quad (19)$$

The logic equations for encoder 100 of FIGS. 1 and A1 are given in Table I.

Figure 2:
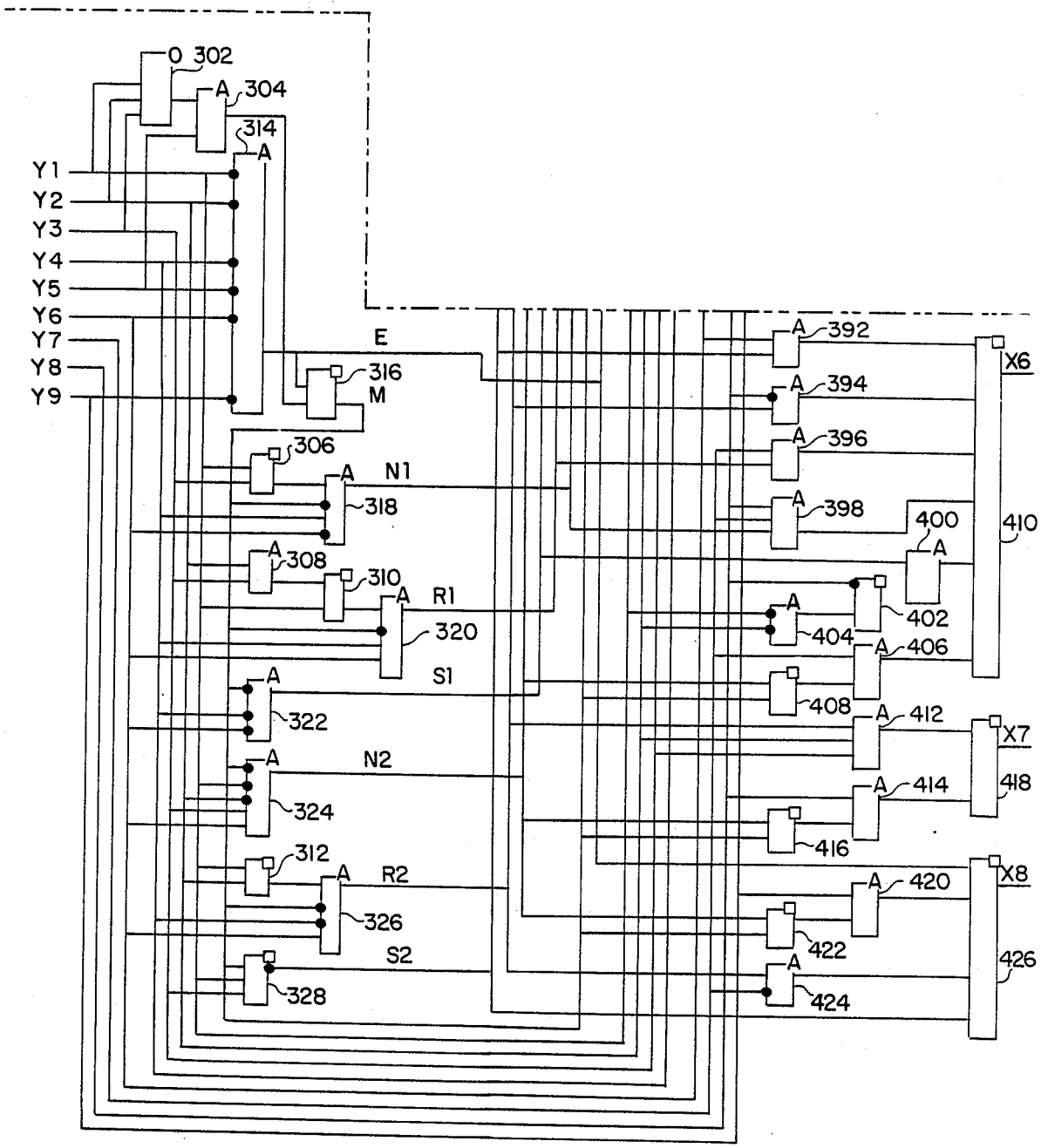
FIGS. 2 and 2A are a schematic diagram of a PRML system modulation code decoder for a code having rate 8/9 and run length constraints (0,3/5), constructed according to the principles of the present invention.
Figure 2A:
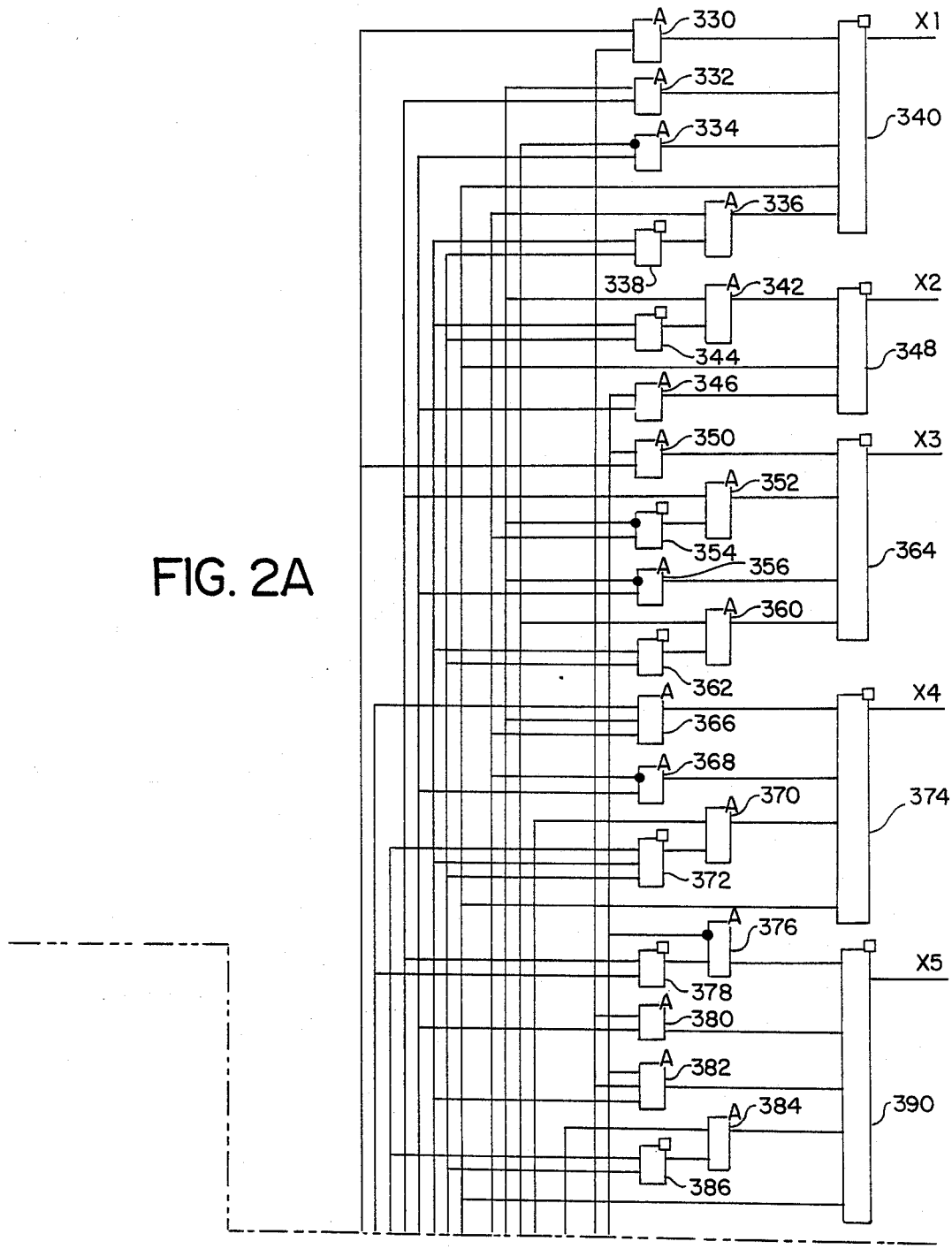

The decoder function of FIGS. 2 and 2A identifies the same partitions as those in the encoder, using the exclusive structures of bit patterns in the 9-bit sequence Y to obtain logic equations for the components of X. Decoder equations for the decoder 300 of FIGS. 2 and 2A are provided in Table III.

Referring now to FIGS. 1 and 1A, encoded variables, $X_1$–$X_8$ enter encoder 100 at receiver lines $X_1$ to $X_8$ of encoder 100. The receiver lines $X_1$ and $X_8$ are coupled to encoder gates 102–274. In response to such varibles, codewords are produced by encoder gates 102–274 in the following manner. Encoder gates 102–146 produce codeword partitions M, $N_1$, $R_1$, $S_1$, $N_2$, $R_2$, $S_2$, and E respectively. Finally, encoded variables $Y_1$–$Y_9$ are produced by encoder gates 148–164, 166–182, 184–194, 196–204, 206–210, 212–220, 222–234, 236–254 and 256–274, respectively.

Coded variables, $Y_1$–$Y_9$, enter decoder 300 at receiver lines $Y_1$ to $Y_9$ as shown in FIGS. 2 and 2A. The receiver lines $Y_1$ to $Y_9$ are coupled to decoder gates 302–426. Backward reading, codeword partitions E, M, $N_1$, $R_1$, and $S_1$, for recreating uncoded variables, i.e. the data, are produced by decoder gates 302–322, respectively, in response to coded variables $Y_1$–$Y_9$. Similarly, partitions $N_2$, $R_2$ and $S_2$ are produced by decoder gates 324–328, respectively. Finally, the data, $X_1$–$X_8$, is provided by decoder gates 330–340, 342–348, 350–364, 366–374, 376–390, 392–410, 412–418 and 420–426, respectively.

The code described in this specification is an optimum code in that k cannot be decreased without decreased without increasing k, decreasing the rate, increasing the codeword length, or increasing the number of encoder states. This modulation code provides a reduced k parameter (k=3) relative to the (0,4/4) code (k=4) for improved timing and gain control information, and it achieves this without increasing the $k_1$ parameter as much as the (0,3/6) code ($k_1$=5 versus $k_1$=6). The $k_1$ parameter directly influences the hardware requirements in the Viterbi detector path memory, as well as the size of the most probable error bursts. The maximum error propagation of the (0,3/5) code is the same as that of the (0,3/6) code.

While the invention has been particularly shown and described with reference to a preferred embodiment thereof, it will be understood by those skilled in the art that various changes in detail may be made therein without departing from the spirit, scope and teaching of the invention. For example, a software implementation of the encoder and decoder circuit functions is possible. Accordingly, the apparatus and method herein disclosed are to be considered merely as illustrative, and the invention is to be limited only as specified in the claims.

TABLE I
(0,3/5) Encoder

Partitions:

$M_1 = (X_1 + X_2 + X_3)$  
$M_2 = (X_7 + X_8)$  
$M_3 = (X_2 + X_4 + X_5 + X_7)$  
$M = M_1M_2M_3$  
$E = X_1X_2X_3X_4X_5X_6X_7X_8$ $N_1 = \bar{M}_2(X_1 + X_3)X_4$  
$N_2 = \bar{M}_1(X_8 + X_6)X_5$  
$R_1 = \bar{M}_2(X_2 + X_5X_6)(\bar{X}_1 + X_3)\bar{X}_4$  
$R_2 = \bar{M}_1(\bar{X}_8 + \bar{X}_6)\bar{X}_5$  
$S_1 = \bar{M}_2(\bar{X}_2 + \bar{X}_5\bar{X}_6)(X_1 + X_3)\bar{X}_4$  
$S_2 = \bar{M}_3(X_1 + X_3)\bar{X}_8$ Encoding Functions:

$Y_1 = (\bar{E}M + N_1)X_1 + R_1\bar{X}_4 + R_2(X_4 + \bar{X}_7) + S_1X_3(X_1 + \bar{X}_6)$
$Y_2 = (\bar{E}M + N_1)X_2 + R_1\bar{X}_3 + R_2(X_4 + X_7) + S_1X_1 + S_2(\overline{PAST})$
$Y_3 = (M + N_1)X_3 + N_2 + R_1\bar{X}_1 + R_2(\bar{X}_4 + X_7) + S_1$
$Y_4 = (\bar{E}M + N_1)X_4 + N_2X_4 + R_1 + S_2$
$Y_5 = \bar{E}M + S_2(PAST)$
$Y_6 = (\bar{E}M + N_2)X_5 + R_1 + R_2 + S_2X_6$
$Y_7 = (M + N_2)X_6 + N_1(\bar{X}_5 + X_6) + R_1X_6 + R_2\bar{X}_8 + S_1 + S_2$
$Y_8 = (M + N_2)X_7 + N_1(X_5 + X_6) + R_1X_5 + R_2\bar{X}_6 + S_1(\bar{X}_1 + \bar{X}_6) + S_2X_1$
$Y_9 = (\bar{E}M + N_2)X_8 + N_1(X_5 + \bar{X}_6) + R_1X_2 + R_2\bar{X}_5 + S_1\bar{X}_5 + S_2X_3$ Past = Last digit in previous codeword (set PAST = 0 for (0,3/6) code).

TABLE II
(0,3/5) Decoder

Partitions:

$E = \bar{Y}_1\bar{Y}_2\bar{Y}_4\bar{Y}_5\bar{Y}_6\bar{Y}_9$  
$M = Y_5(Y_1 + Y_2 + Y_3) + E$  
$N_1 = \bar{M}(Y_1 + Y_3)Y_4\bar{Y}_6$  
$N_2 = \bar{M}\bar{Y}_1\bar{Y}_2Y_3Y_6$ $R_1 = \bar{M}(Y_1 + Y_2Y_3)Y_4Y_6$  
$R_2 = \bar{M}(Y_1 + Y_2)\bar{Y}_4Y_6$  
$S_1 = \overline{MY_4Y_6}$  
$S_2 = \bar{M}(\bar{Y}_1 + \bar{Y}_3)$ Encoding Functions:

$X_1 = E + (M + N_1)Y_1 + R_1\bar{Y}_3 + S_1Y_2 + S_2Y_8$
$X_2 = E + (M + N_1)Y_2 + R_1Y_9$
$X_3 = (M + N_1)Y_3 + R_1\bar{Y}_2 + S_1(Y_1 + \bar{Y}_2) + S_2Y_9$
$X_4 = E + (M + N_1)Y_4 + N_2Y_4 + R_1\bar{Y}_1 + R_2Y_1Y_2$
$X_5 = E + (M + N_2)Y_6 + N_1Y_8Y_9 + R_1Y_8 + R_2\bar{Y}_9 + S_1\bar{Y}_9$
$X_6 = (M + N_2)Y_7 + N_1Y_7Y_8 + R_1Y_7 + R_2\bar{Y}_8 + S_1(\bar{Y}_1\bar{Y}_2 + \bar{Y}_8) + S_2Y_6$
$X_7 = (M + N_2)Y_8 + R_2Y_2Y_3$
$X_8 = E + (M + N_2)Y_9 + R_2\bar{Y}_7 + S_2$

TABLE III

List of 251 9-bit words (converted to decimal) which can be freely concatenated to form strings satisfying the 0,3/5 constraint:

| | | | | | | | | | | | | | | | | |
|---|---|---|---|---|---|---|---|---|---|---|---|---|---|---|---|---|
| 70 | 71 | 73 | 75 | 77 | 78 | 79 | 82 | 83 | 86 | 87 | 89 | 90 | 91 | 93 | 94 | 95 |
| 99 | 101 | 102 | 103 | 105 | 107 | 109 | 110 | 111 | 113 | 114 | 115 | 117 | 118 | 119 | 121 | 122 |
| 123 | 125 | 126 | 127 | 145 | 146 | 147 | 149 | 150 | 151 | 153 | 154 | 155 | 157 | 158 | 159 | 177 |
| 178 | 179 | 181 | 182 | 183 | 185 | 186 | 187 | 189 | 190 | 191 | 197 | 198 | 199 | 201 | 203 | 205 |
| 206 | 207 | 209 | 210 | 211 | 213 | 214 | 215 | 217 | 218 | 219 | 221 | 222 | 223 | 227 | 229 | 230 |
| 231 | 233 | 235 | 237 | 238 | 239 | 241 | 242 | 243 | 245 | 246 | 247 | 249 | 250 | 251 | 253 | 254 |
| 255 | 274 | 275 | 278 | 279 | 281 | 282 | 283 | 285 | 286 | 287 | 291 | 293 | 294 | 295 | 297 | 299 |
| 301 | 302 | 303 | 305 | 306 | 307 | 309 | 310 | 311 | 313 | 314 | 315 | 317 | 318 | 319 | 326 | 327 |
| 329 | 331 | 333 | 334 | 335 | 338 | 339 | 342 | 343 | 345 | 346 | 347 | 349 | 350 | 351 | 355 | 357 |
| 358 | 359 | 361 | 363 | 365 | 366 | 367 | 369 | 370 | 371 | 373 | 374 | 375 | 377 | 378 | 379 | 381 |
| 382 | 383 | 393 | 395 | 397 | 398 | 399 | 401 | 402 | 403 | 405 | 406 | 407 | 409 | 410 | 411 | 413 |
| 414 | 415 | 419 | 421 | 422 | 423 | 425 | 427 | 429 | 430 | 431 | 433 | 434 | 435 | 437 | 438 | 439 |
| 441 | 442 | 443 | 445 | 446 | 447 | 453 | 454 | 455 | 457 | 459 | 461 | 462 | 463 | 465 | 466 | 467 |
| 469 | 470 | 471 | 473 | 474 | 475 | 477 | 478 | 479 | 483 | 485 | 486 | 487 | 489 | 491 | 493 | 494 |

TABLE III-continued

List of 251 9-bit words (converted to decimal) which can be freely concatenated to form strings satisfying the 0,3/5 constraint:

| 495 | 497 | 498 | 499 | 501 | 502 | 503 | 505 | 506 | 507 | 509 | 510 | 511 |

TABLE IV

List of the six state-dependent codewords:

```
0 A 0 1 B 0 1 0 1
0 A 0 1 B 0 1 1 0
0 A 0 1 B 0 1 1 1
0 A 0 1 B 1 1 0 1
0 A 0 1 B 1 1 1 0
0 A 0 1 B 1 1 1 1
``` where A = (PAST)
B = (PAST)
PAST being a binary variable that defines the state and is given by the last digit of the preceding codeword. The possible values of codewords which may result are:

| DATA | State 1 (PAST = 1) | State 2 (PAST = 0) |
| --- | --- | --- |
| 00100001 (33) | 000110101 (53) | 010100101 (165) |
| 00100101 (37) | 000111101 (61) | 010101101 (173) |
| 10000001 (129) | 000110110 (54) | 010100110 (166) |
| 10000101 (133) | 000111110 (62) | 010101110 (174) |
| 10100001 (161) | 000110111 (55) | 010100111 (167) |
| 10100101 (165) | 000111111 (63) | 010101111 (175) |

What is claimed is:

1. Apparatus for encoding a preselectable number of bits of binary data into codewords having a preselectable number of bits, said apparatus comprising:
   receiver means for receiving the preselectable number of bits of binary data; and
   encoder means, coupled to the receiver means, for producing sequences of codewords each having at least two interleaved odd and even subsequences in response to said bits of binary data;
   said sequences of interleaved subsequences having no more than three consecutive zeroes therein; and
   said odd and even subsequences each having no more than five consecutive zeroes therein;
   said number of bits in the encoded binary data having a ratio of 8/9 to the number of bits in codewords.

2. Apparatus as in claim 1 wherein the number of codewords are increased by having each codeword establish a state dependency on selected bits in the previous codeword.

3. Apparatus as in claim 1 wherein:
   the encoder means includes a plurality of gating means for producing the codewords as partitions and output gating means for combining the partitions of codewords into the sequences of codewords.

4. Apparatus as in claim 1 further including decoding means for decoding a preselectable number of codewords into a preselectable number of bits of binary data, said decoding means comprising:
   receiver means for receiving the codewords; and
   decoder means, coupled to the receiver means, for producing sequences of binary data in response to said codewords.

5. Apparatus as in claim 4 wherein the decoder means includes a plurality of gating means for producing the partitions of binary data and output gating means for combining the partitions of binary data into the sequences of binary data.

6. A method for encoding a preselectable number of bits of binary data into codewords having a preselectable number of bits, said method comprising the steps of:
   receiving the binary data; and
   encoding the binary data by producing sequences of codewords each having at least two interleaved odd and even subsequences from said binary data;
   said sequences of interleaved subsequences having no more than three consecutive zeroes therein; and
   said odd and even subsequences having no more than five consecutive zeroes therein;
   said number of bits in the encoded binary data having a ratio of 8/9 to the number of bits in the codewords.

7. The method as in claim 6 wherein the number of codewords are increased by having each codeword establish a state dependency on selected bits in the previous codeword.

* * * * *